United States Patent
Watanabe

(10) Patent No.: US 10,051,744 B2
(45) Date of Patent: Aug. 14, 2018

(54) INSERTION HEAD, COMPONENT INSERTION DEVICE, AND COMPONENT MOUNTING LINE

(71) Applicant: Panasonic Intellectual Property Management Co., Ltd., Osaka (JP)

(72) Inventor: Hideaki Watanabe, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 387 days.

(21) Appl. No.: 14/799,960

(22) Filed: Jul. 15, 2015

(65) Prior Publication Data

US 2016/0073513 A1  Mar. 10, 2016

(30) Foreign Application Priority Data

Sep. 8, 2014  (JP) .................................. 2014-181939

(51) Int. Cl.
| | |
|---|---|
| *H05K 3/30* | (2006.01) |
| *H05K 13/04* | (2006.01) |
| *B25J 15/00* | (2006.01) |
| *B25J 15/02* | (2006.01) |

(52) U.S. Cl.
CPC .......... *H05K 3/306* (2013.01); *B25J 15/0004* (2013.01); *B25J 15/026* (2013.01); *H05K 13/0404* (2013.01); *Y10T 29/53183* (2015.01)

(58) Field of Classification Search
CPC ............. H05K 13/0404; H05K 13/0413; B25J 15/026; Y10T 29/53183
See application file for complete search history.

(56) References Cited

U.S. PATENT DOCUMENTS

| | | | | |
|---|---|---|---|---|
| 4,833,776 A | * | 5/1989 | Wakamiya | ......... H05K 13/0404 29/593 |
| 2006/0016614 A1 | * | 1/2006 | Yokoyama | ............. H02G 11/00 174/69 |
| 2012/0286534 A1 | | 11/2012 | Harada et al. | |

FOREIGN PATENT DOCUMENTS

| | | | | |
|---|---|---|---|---|
| EP | 0223012 A2 | * | 5/1987 | .......... B25J 17/0208 |
| EP | 0331914 A2 | * | 9/1989 | .............. B25J 9/126 |
| JP | 2012-236258 A | | 12/2012 | |

* cited by examiner

Primary Examiner — Livius R Cazan
(74) Attorney, Agent, or Firm — Pearne & Gordon LLP

(57) ABSTRACT

An insertion head includes: a horizontal shaft member; one pair of gripping claws, extending on a surface orthogonal to the horizontal shaft member; one pair of gripping claw holding members movable on the horizontal shaft member which hold the one pair of gripping claws; a swing mechanism which rotates and drives the shaft member, and swings the one pair of gripping claw holding members around a center axis of the shaft member; and an interval changing mechanism which moves the one pair of gripping claw holding members on the shaft member and changes an interval between the one pair of gripping claws. The gripping claw extends to be bent on the surface, and each straight line portion of each tip end is offset to a perpendicular axis extending on the surface through a center axis of the shaft member in a posture of being oriented downward.

6 Claims, 19 Drawing Sheets

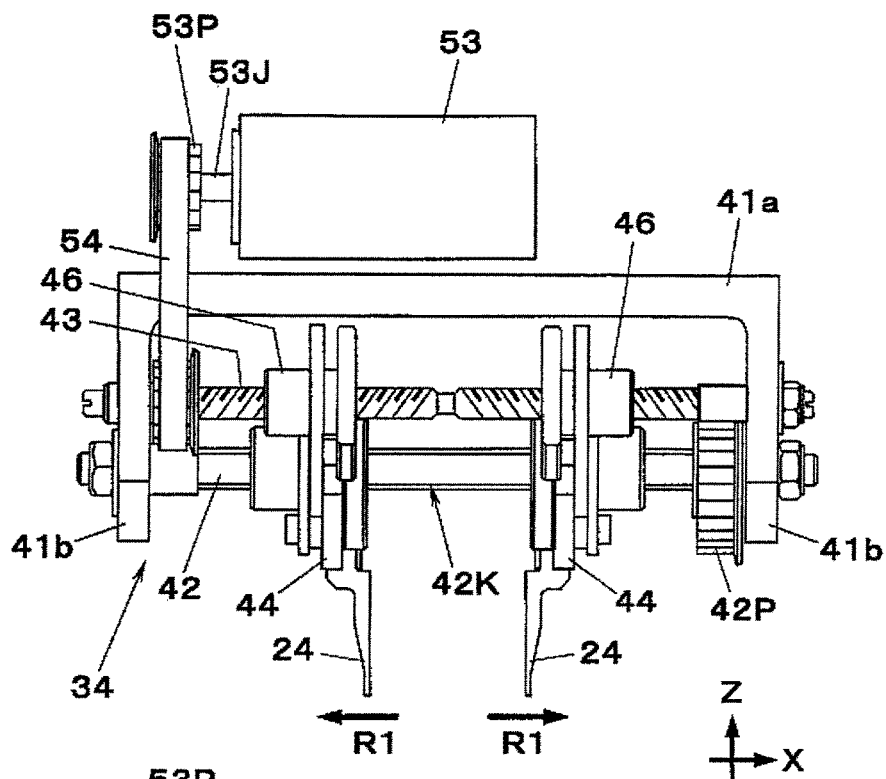
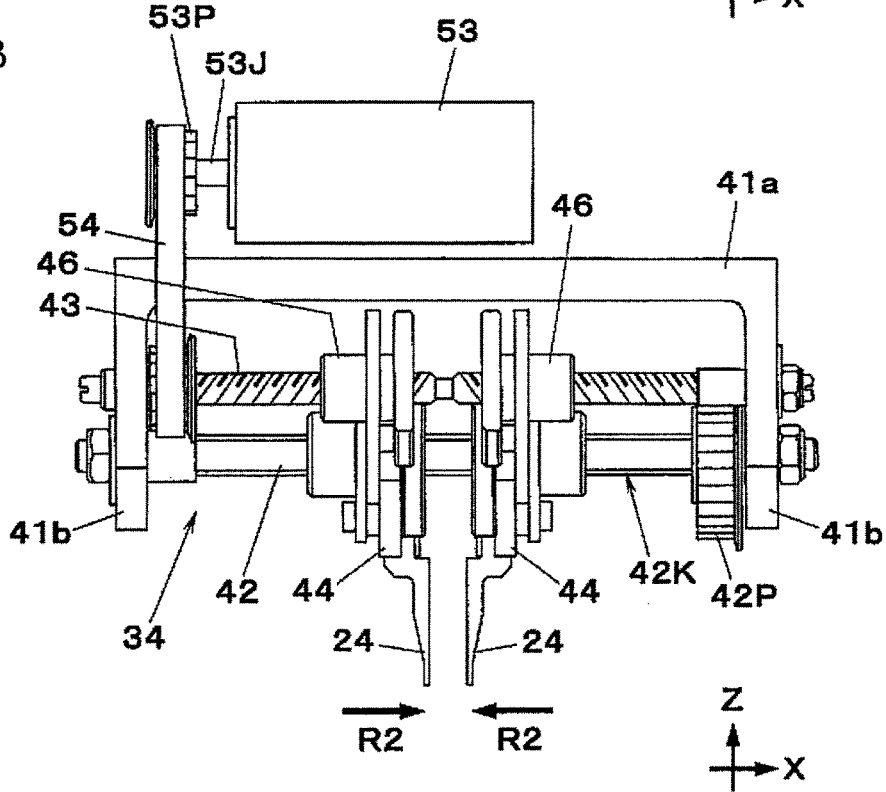

INSERTION HEAD, COMPONENT INSERTION DEVICE, AND COMPONENT MOUNTING LINE

CROSS-REFERENCES TO RELATED APPLICATION(S)

This application is based on and claims priority from Japanese Patent Application No. 2014-181939 filed on Sep. 8, 2014, the entire contents of which are incorporated herein by reference.

BACKGROUND

1. Field of the Invention

One or more embodiments of the present invention relate to an insertion head which is provided in a component inserting device, grips a leaded component, and inserts one or more leads of the leaded component into one or more insertion holes provided on a printed circuit board, a component insertion device, and a component mounting line.

2. Description of Related Art

A component insertion device which inserts one or more leads of a leaded component into one or more insertion holes provided on a printed circuit board and performs mounting the leaded component onto the printed circuit board, is provided with an insertion head which grips the leaded component supplied by a component supply device. The insertion head grips the leaded component by changing an interval between one pair of gripping claws. Some insertion heads can grip the leaded component supplied in various postures by swinging the one pair of gripping claws by rotation of a horizontal shaft member (for example, refer to Patent Document 1).

Patent Document 1 is JP-A-2012-236258.

SUMMARY

In a component insertion device, when inserting one or more leads into one or more insertion holes of a printed circuit board, a leaded component which is gripped by gripping claws is vertically pressed onto the printed circuit board. For this reason, it is necessary that a direction in which each straight line portion of each tip end extends substantially matches a direction in which one or more leads of the leaded component extend at a point when the gripping claws grip the leaded component. Therefore, when the gripping claws of an insertion head have a shape of extending straightly downward, the leaded component is supplied in a posture (standing posture) of being oriented downward. When the gripping claws swing by rotation of the shaft member, by swinging the gripping claws, it is also possible to grip the leaded component which is supplied not in the standing posture, but in a non-standing posture (for example, a posture of being laid on a component supplying tray). However, when a swing angle from a perpendicular posture of the gripping claws is large, a position of a swing shaft which swings the gripping claws may become a position on a side in a horizontal direction of the straight line portion of the tip end of the swung gripping claws, and a part which is near the swing shaft may interfere with another leaded component which is adjacent to the leaded component targeted to be gripped and the leaded component targeted to be gripped cannot be stably gripped.

Here, an object of the present invention is to provide an insertion head, a component insertion device, and a component mounting line which can stably grip a leaded component regardless of a posture of the leaded component during the supply.

According an aspect of the embodiment, there is provided an insertion head including: a horizontal shaft member; one pair of gripping claws, each gripping claw extending on a surface which is orthogonal to the horizontal shaft member; one pair of gripping claw holding members which are provided to be movable on the horizontal shaft member, and hold the one pair of gripping claws; a swing mechanism which rotates and drives the horizontal shaft member, and swings the one pair of gripping claw holding members around a center axis of the horizontal shaft member; and an interval changing mechanism which moves the one pair of gripping claw holding members on the horizontal shaft member and changes an interval between the one pair of gripping claws, wherein a leaded component is gripped with the one pair of gripping claws, and a lead of the leaded component is inserted into an insertion hole on a printed circuit board and each of the gripping claws respectively extends to be bent on the surface, and each straight line portion of each tip end is offset with respect to a perpendicular axis which extends on the surface through a center axis of the horizontal shaft member in a posture of being oriented downward.

According another aspect of the embodiment, there is provided a component insertion device including: a component supply portion which supplies the leaded component; the above insertion head; and a control portion which controls the swing mechanism and the interval changing mechanism of the insertion head based on a recognition result of the leaded component by the component recognizing portion to grip the leaded component supplied by the component supply portion with the one pair of gripping claws.

According still another aspect of the embodiment, there is provided a component mounting line including: the above component insertion device; and at least one component mounting devices which mounts a surface mounting component to the printed circuit board, wherein the component insertion device and the at least one component mounting devices are linked.

According to the present invention, it is possible to stably grip the leaded component with the insertion head regardless of the posture of the leaded component during the supply.

BRIEF DESCRIPTION OF THE DRAWINGS

FIGS. 10A and 10B are front views of the gripping unit which is provided in the insertion head according to the embodiment of the present invention.

DETAILED DESCRIPTION

Figure 1:
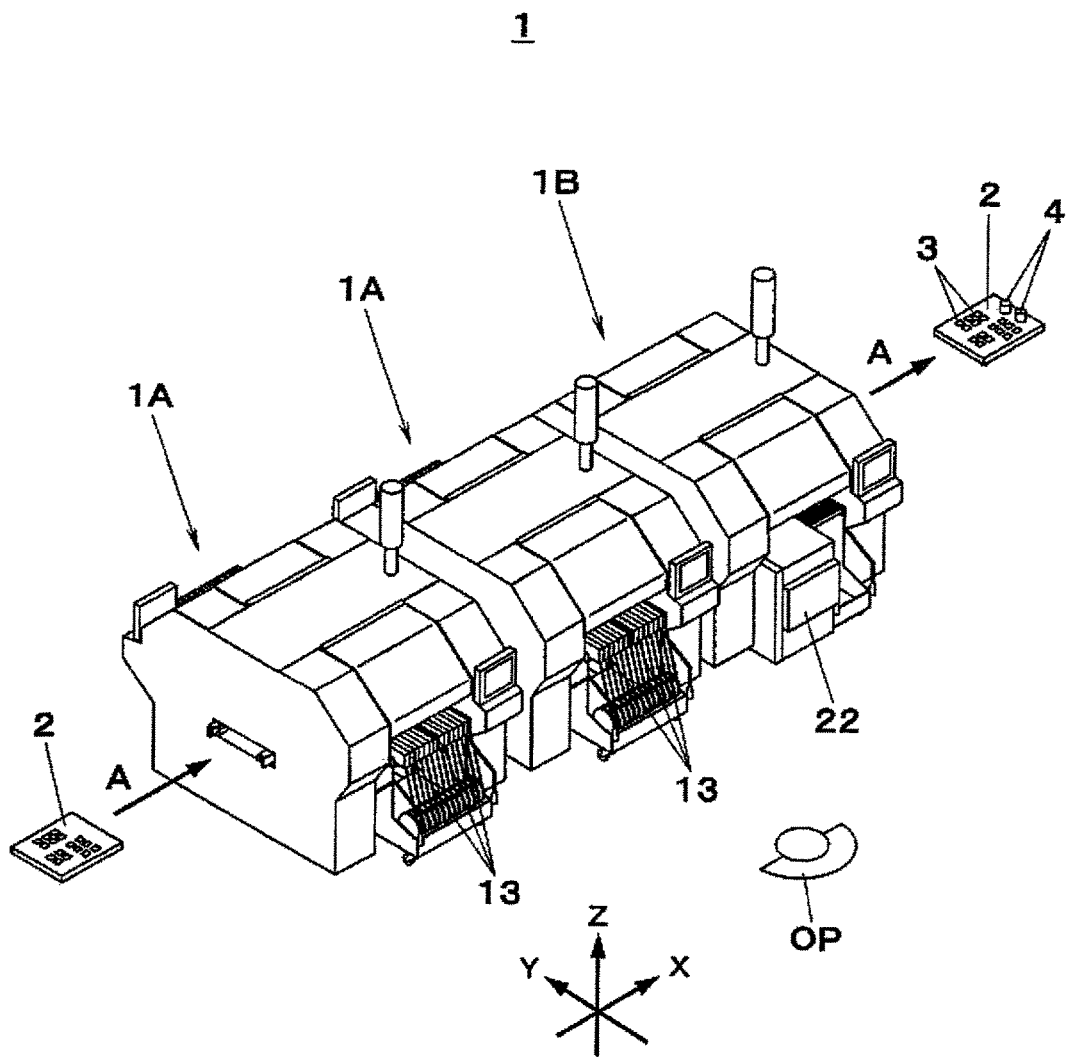
FIG. 1 is a perspective view illustrating an external appearance of a component mounting line according to an embodiment of the present invention.

Hereinafter, an embodiment of the present invention will be described with reference to the drawings. FIG. 1 illustrates a component mounting line 1 according to the embodiment of the present invention. In the component mounting line 1, a component mounting device 1A which mounts a surface mounting component 3 onto a surface of a printed circuit board 2, and a component insertion device 1B which inserts a leaded component into the printed circuit board 2 on which the surface mounting component 3 is mounted, are linked to each other in series. The component insertion device 1B is disposed to be closer to a downstream side of a flow (arrows A illustrated in FIG. 1) of the printed circuit board 2 than the component mounting device 1A.

Figure 2:
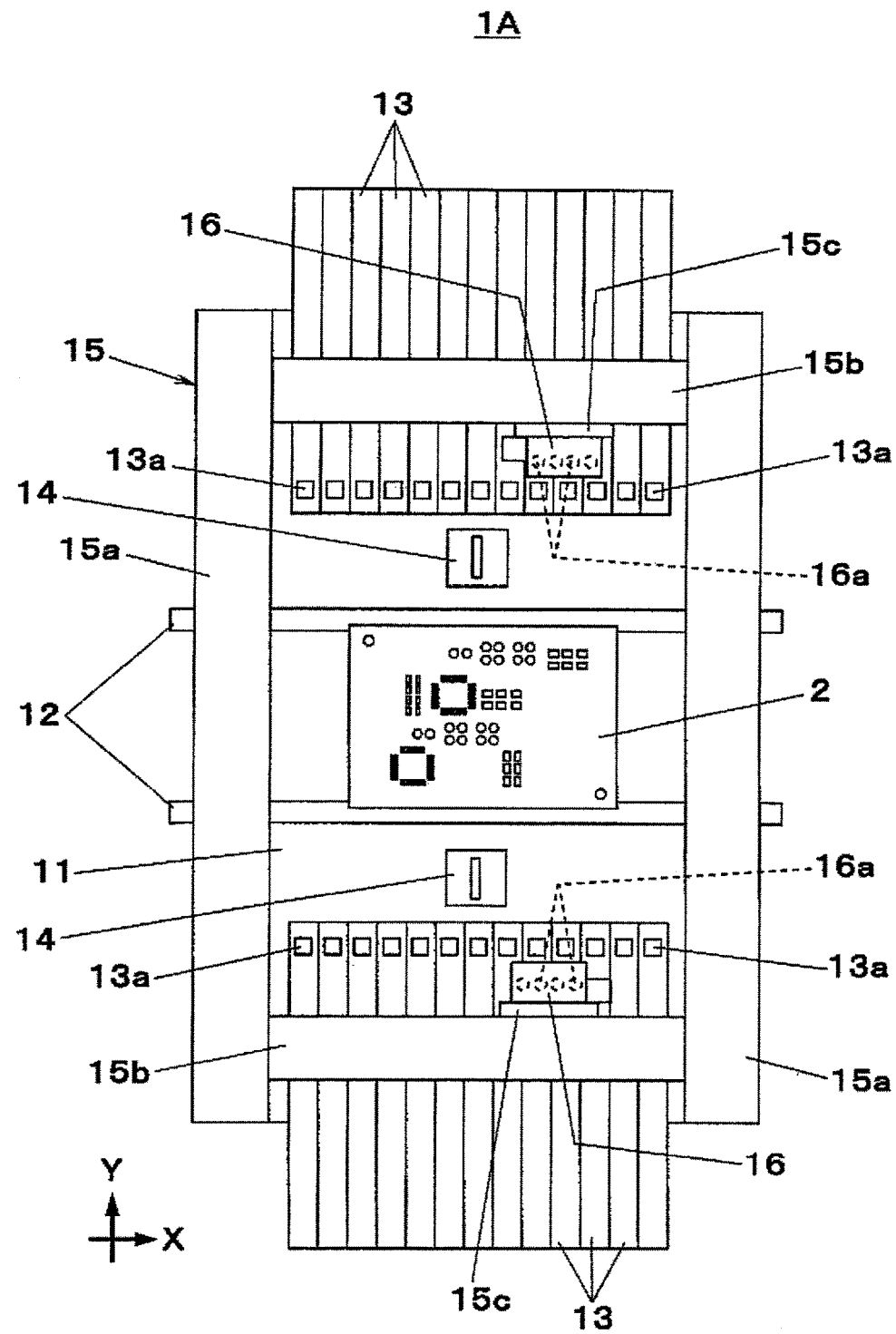
FIG. 2 is a plan view of a component mounting device which is provided in the component mounting line according to the embodiment of the present invention.

In FIG. 2, the component mounting device 1A is provided with a board conveyance path 12, a tape feeder 13, a component camera 14, and a head moving mechanism 15 on a base 11. The board conveyance path 12 conveys the printed circuit board 2 in a horizontal direction (referred to as an X-axis direction) when viewed from an operator OP by one pair of conveyors. The tape feeders 13 are provided in each of both end portions that oppose each other in a longitudinal direction (referred to as a Y-axis direction) of the base 11 when viewed from the operator OP, and sequentially supply the surface mounting components 3 which are not illustrated to a component supply port 13a. The component camera 14 is provided while an imaging visual field is oriented upward in a region between the board conveyance path 12 and the tape feeder 13 on the base 11.

The head moving mechanism 15 includes one pair of Y-axis tables 15a which are provided to extend in the Y-axis direction on the base 11 and face each other in the X-axis direction, two front and rear X-axis tables 15b which extend in the X-axis direction and in which both ends are driven in the Y-axis direction by the Y-axis table 15a, and head attaching plates 15c which are driven in the X-axis direction by each of the X-axis tables 15b. Mounting heads 16 which are provided with a plurality of suction nozzles 16a that extend downward are attached to each of the head attaching plates 15c. Each of the mounting heads 16 moves on a horizontal surface by movement of the X-axis table 15b in the Y-axis direction and movement of the head attaching plate 15c in the X-axis direction. Accordingly, the mounting head 16 sucks (picks up) the surface mounting component 3 which is supplied by the tape feeder 13 by using the suction nozzle 16a, and mounts (mounts on the surface) the surface mounting component 3 onto the printed circuit board 2 which is positioned by the board conveyance path 12 after making the component camera 14 recognize the surface mounting component 3.

Figure 3:
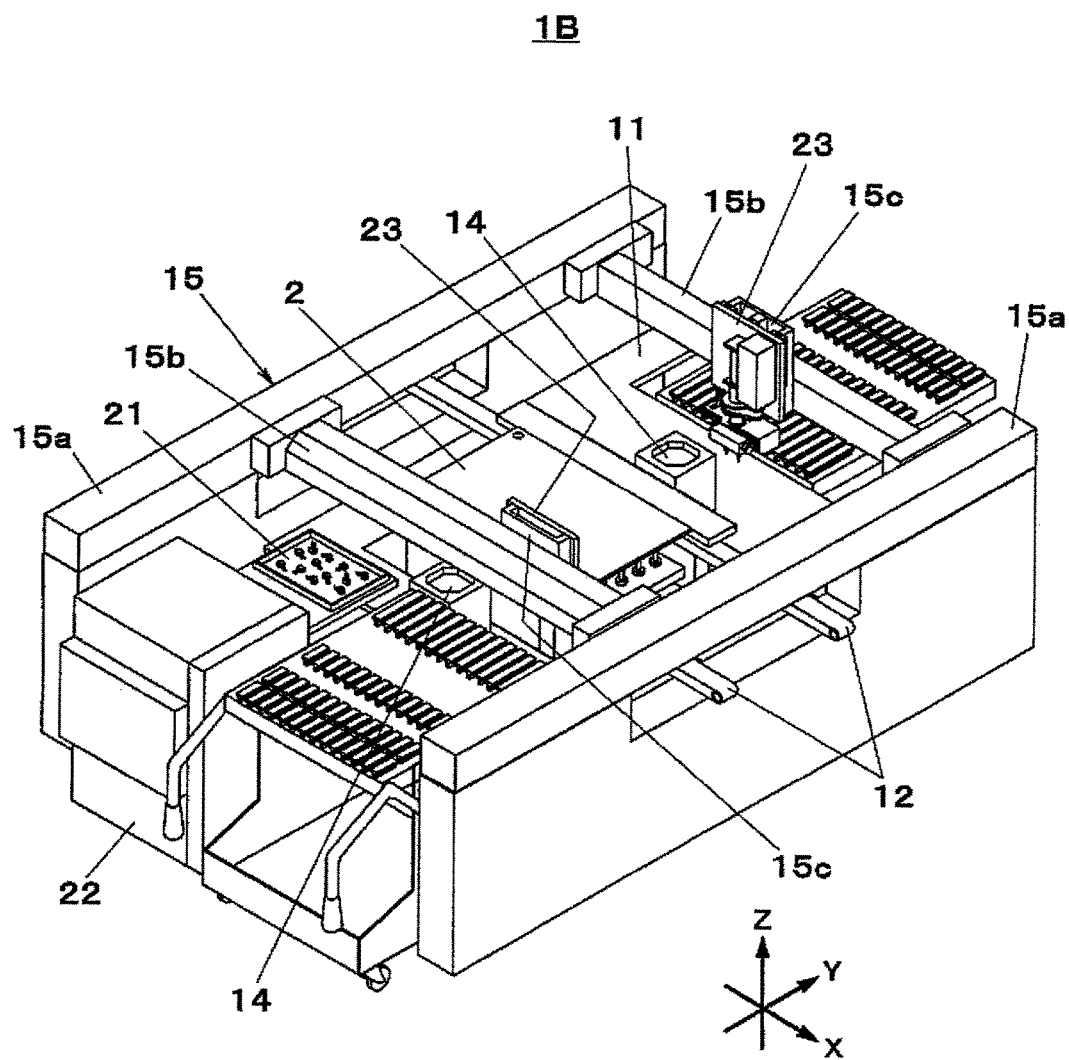
FIG. 3 is a perspective view of a component insertion device according to the embodiment of the present invention.

Similarly to the component mounting device 1A, the component insertion device 1B illustrated in FIG. 3 includes the board conveyance path 12, the component camera 14, and the head moving mechanism 15 on the base 11. On one side which opposes to the base 11 in the longitudinal direction, a tray feeder 22 which supplies a leaded component 4 in a state of being placed on a tray 21 is disposed. Instead of the mounting head 16 of the component mounting device 1A, an insertion head 23 is attached to the head attaching plate 15c of the head moving mechanism 15.

Figure 4:
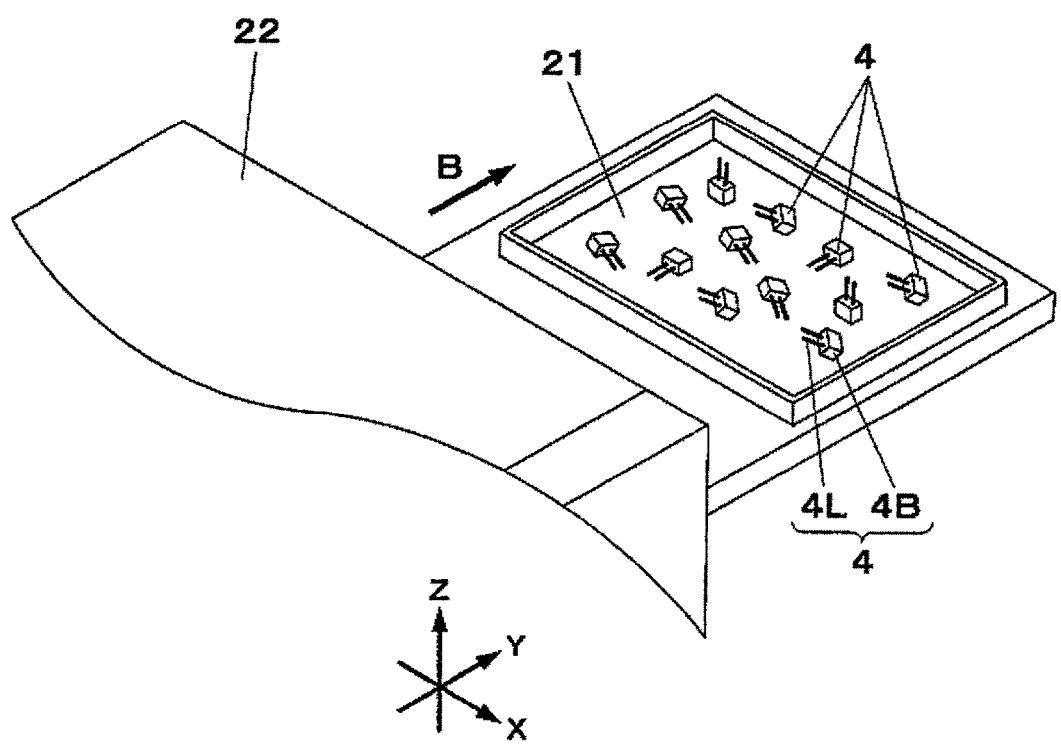
FIG. 4 is a perspective view of a tray feeder which is provided in the component insertion device according to the embodiment of the present invention.

In FIG. 4, the leaded component 4 includes a main body portion 4B, and a plurality of leads 4L which extend from the main body portion 4B. The plurality of leaded components 4 which are placed on the tray 21 of the tray feeder 22 are not particularly aligned, and are oriented in various directions. The tray feeder 22 supplies the leaded component 4 into a movable region of the insertion head 23 by sending out the tray 21 to the board conveyance path 12 side (arrow B illustrated in FIG. 4).

Figure 5:
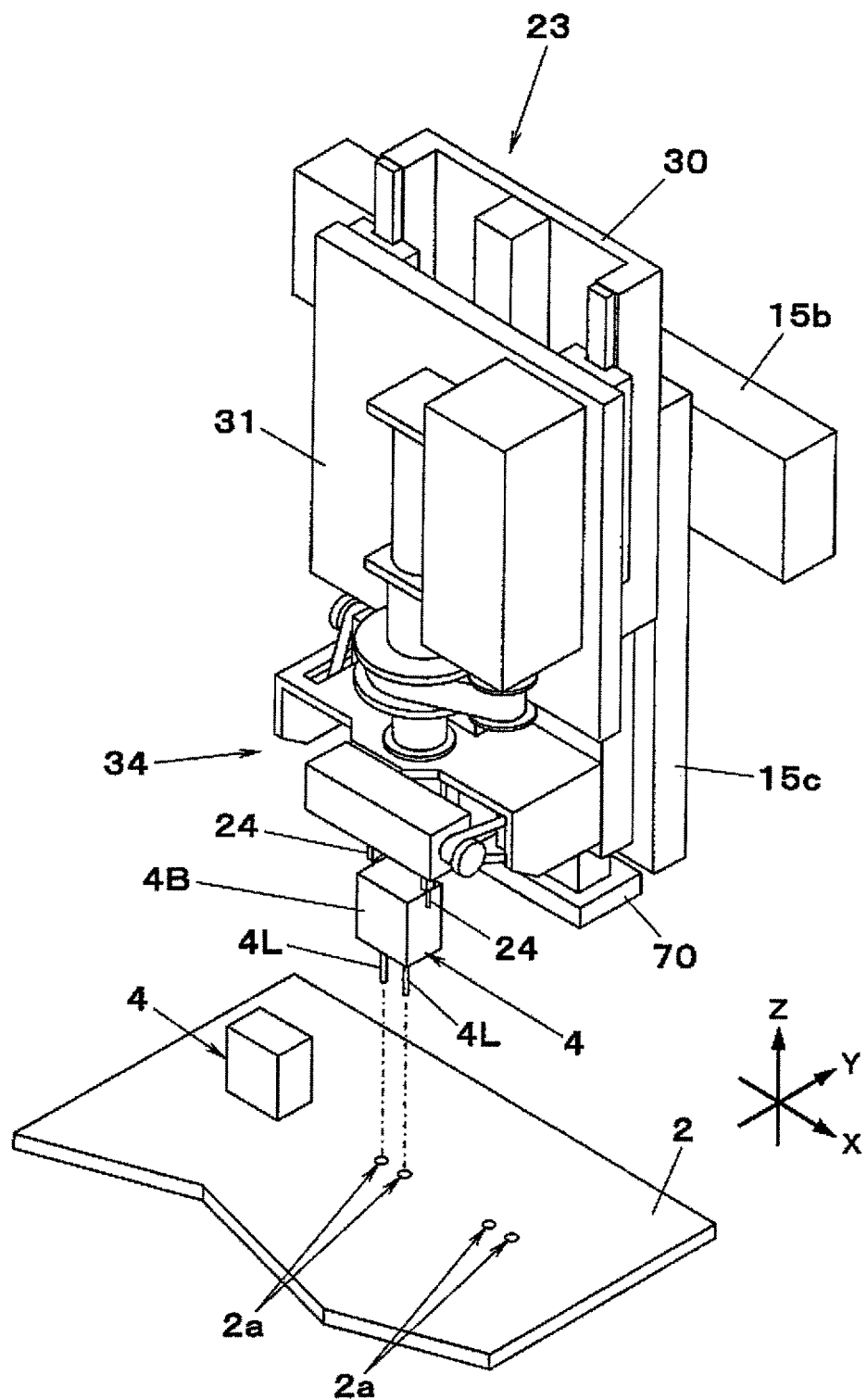
FIG. 5 is a perspective view illustrating an insertion head which is provided in the component insertion device according to the embodiment of the present invention together with the tray feeder.

In FIG. 5, the insertion head 23 is provided with one pair of gripping claws 24 which grip the leaded component 4 on the tray 21. The head moving mechanism 15 moves the two insertion heads 23 independently from each other, and grips the leaded component 4 which is supplied by the tray feeder 22 by each insertion head 23 with one pair of gripping claws 24. In addition, the head moving mechanism 15 moves the gripped leaded component 4 above insertion holes 2a of the printed circuit board 2 which is positioned by the board conveyance path 12 (FIG. 5), and mounts the leaded component 4 by pushing the leaded component 4 into the printed circuit board 2 so that the leads 4L are inserted into the insertion holes 2a.

Figure 6:
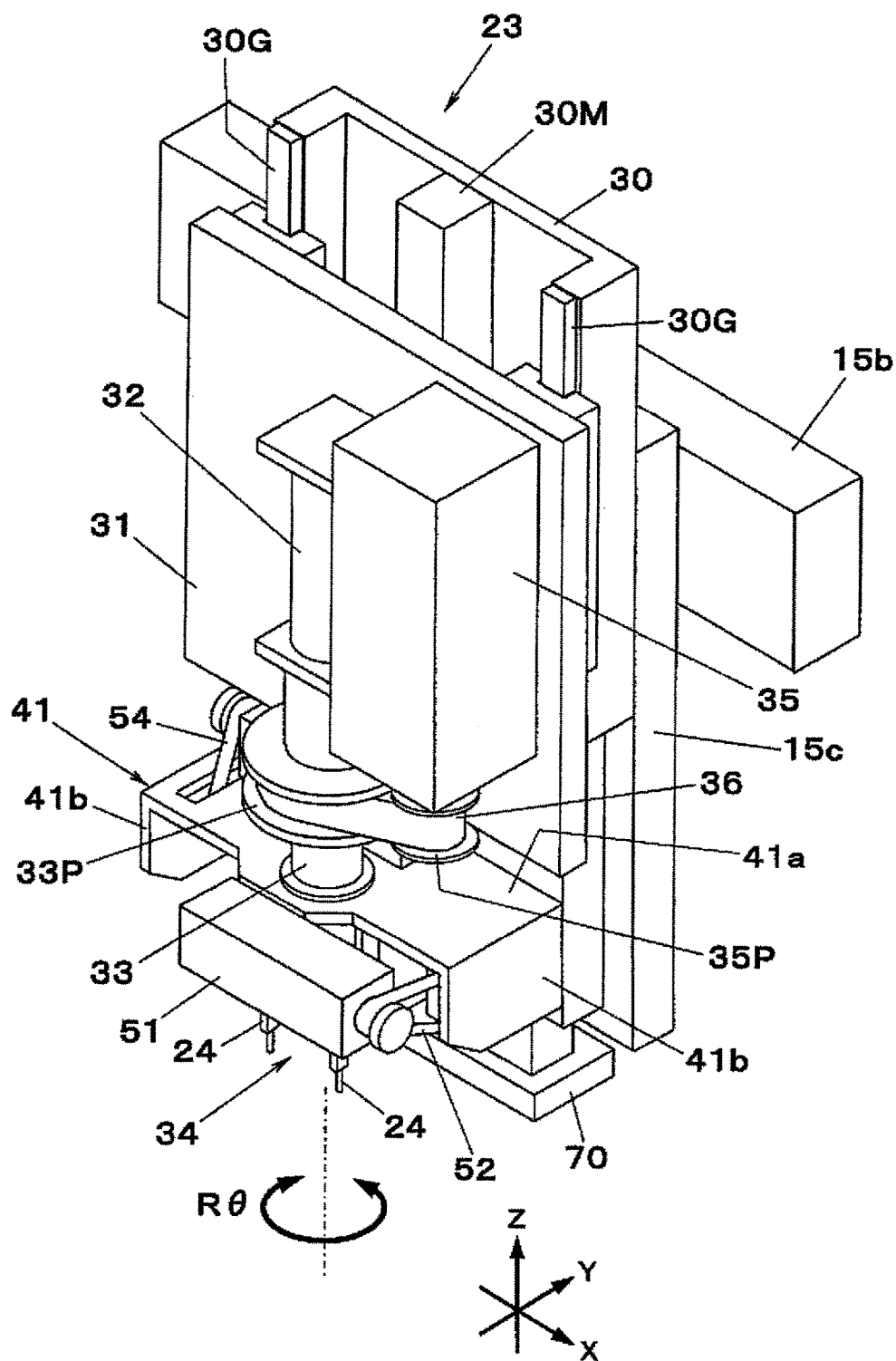
FIG. 6 is a perspective view of the insertion head which is provided in the component insertion device according to the embodiment of the present invention.

In the embodiment, characteristics of the insertion head 23 which is provided in the component insertion device 1B will be described. In FIG. 6, the insertion head 23 includes a base portion 30, an elevating plate 31, an outer shaft 32, an inner shaft 33, and a gripping unit 34. The base portion 30 is fixed to the head attaching plate 15c. A rear surface side of the elevating plate 31 is guided by one pair of guides 30G which are provided by extending the base portion 30 in a vertical direction, and is elevated up and down with respect to the base portion 30 by an elevating motor 30M which is provided in the base portion 30. The outer shaft 32 is provided to extend in the vertical direction (referred to as a Z-axis direction) on a front surface side of the elevating plate 31, and the inner shaft 33 is provided to be relatively rotatable with respect to the outer shaft 32 inside the outer shaft 32. The gripping unit 34 is attached to a lower end of the inner shaft 33.

In FIG. 6, a θ rotation motor 35 which makes a driving shaft (not illustrated) be oriented downward is provided on the front surface side of the elevating plate 31. A driving pulley 35P is attached to the driving shaft of the θ rotation motor 35, and the driving pulley 35P is linked to a driven pulley 33P which is provided in the inner shaft 33 via a power transmission belt 36. For this reason, it is possible to rotate the inner shaft 33 around a Z axis by the θ rotation motor 35 (arrow Rθ illustrated in FIG. 6), and to control a rotation posture around the Z axis of the gripping unit 34 by controlling a rotating direction and a rotating speed of the driving shaft of the θ rotation motor 35.

Figure 7:
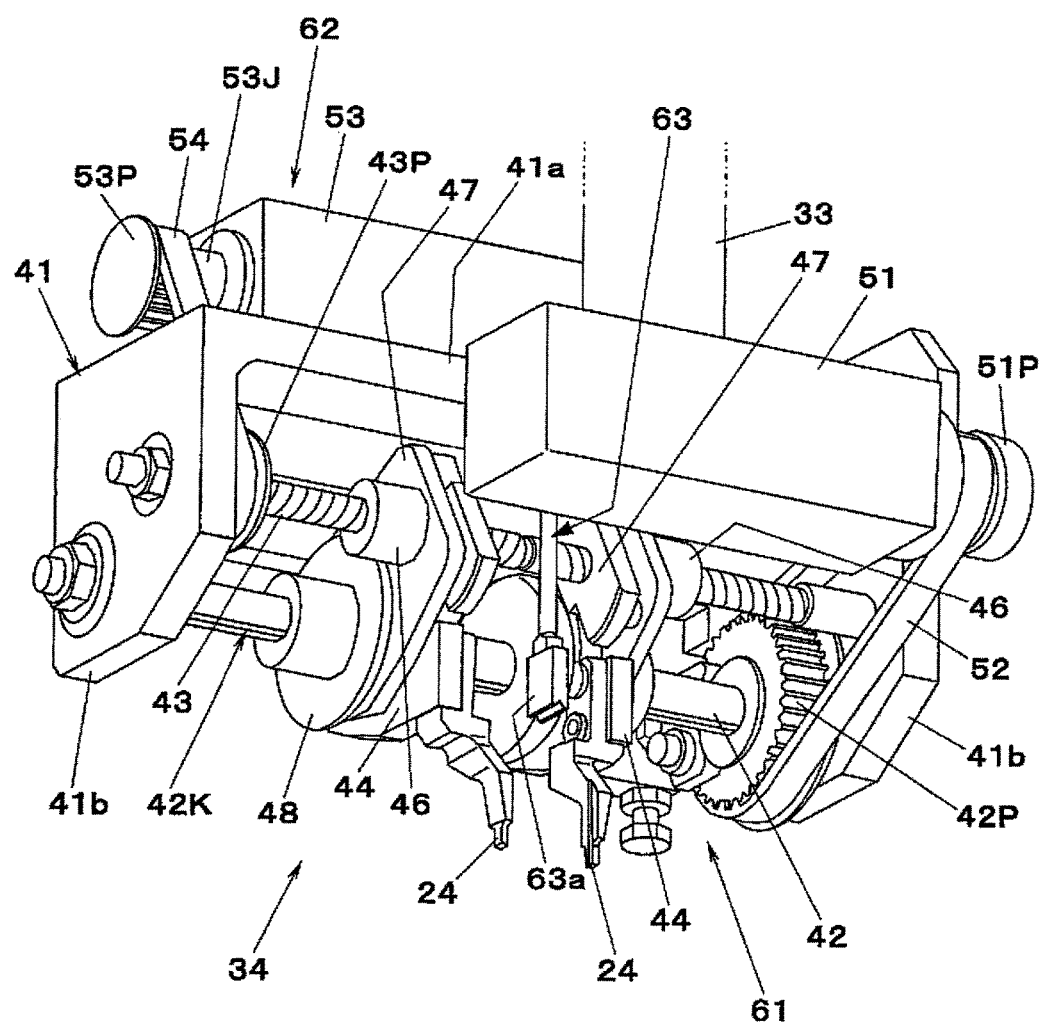
FIG. 7 is a downward perspective view of a gripping unit which is provided in the insertion head according to the embodiment of the present invention.
Figure 8:
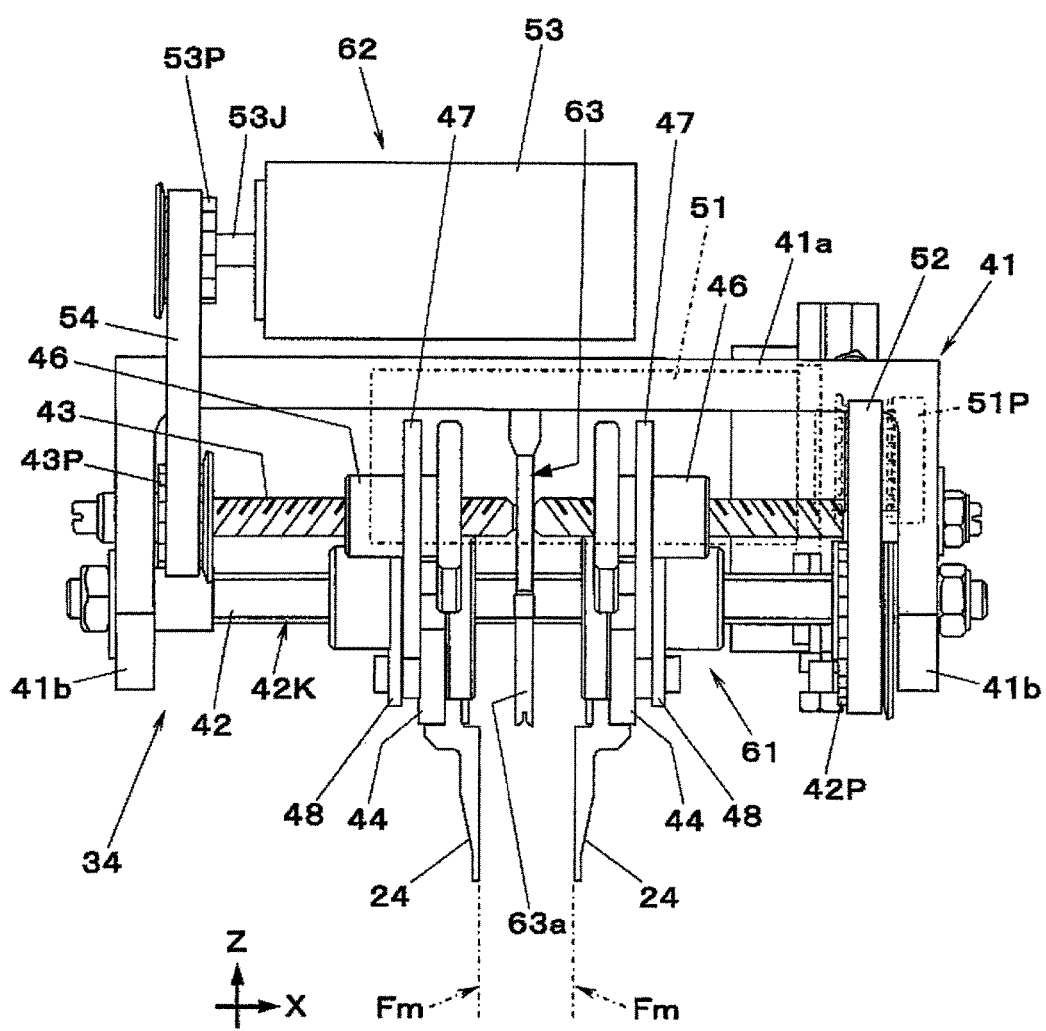
FIG. 8 is a front view of the gripping unit which is provided in the insertion head according to the embodiment of the present invention.

In FIGS. 7 and 8, the gripping unit 34 includes a unit base 41, a swing shaft 42, and an interval changing shaft 43. The unit base 41 includes an upper surface portion 41*a* to which a lower end of the inner shaft 33 is bonded, and one pair of side surface portions 41*b* which extend downward from both ends of the upper surface portion 41*a*. Both ends of the swing shaft 42 and the interval changing shaft 43 are respectively supported by the one pair of the side surface portions 41*b* of the unit base 41, and extend horizontally. The swing shaft 42 and the interval changing shaft 43 are disposed in parallel to each other, and are respectively rotatable around a center axis of the swing shaft 42 and the interval changing shaft 43 themselves.

In FIGS. 7 and 8, one pair (two) of gripping claw holding members 44 are externally fitted to the swing shaft 42, and are respectively movable on the swing shaft 42. The above-described one pair of gripping claws 24 are held by the one pair of gripping claw holding members 44, and the gripping claws 24 which are held by each of the gripping claw holding members 44 extend on surfaces (referred to as swing surfaces Fm) that are orthogonal to the swing shaft 42. In other words, one pair of gripping claw holding members 44 are provided to be movable on the swing shaft 42, and hold the one pair of gripping claws 24 which extend on the swing surfaces Fm.

In FIGS. 7 and 8, a key groove 42K which extends along a direction of the center axis on an outer circumferential surface of the swing shaft 42, and a projection which is not illustrated and engaged with the key groove 42K is formed on an inner circumferential surface of each gripping claw holding member 44. For this reason, while each of the gripping claw holding members 44 can swing along the outer circumferential surface of the swing shaft 42, each of the gripping claw holding members 44 rotates around the center axis of the swing shaft 42 being integrated with the swing shaft 42. When the swing shaft 42 rotates around the center axis, the two gripping claw holding members 44 rotate around the center axis of the swing shaft 42, and accordingly, two gripping claws 24 also swing around the center axis of the swing shaft 42 (arrow R0 illustrated in FIG. 9).

Figure 9:
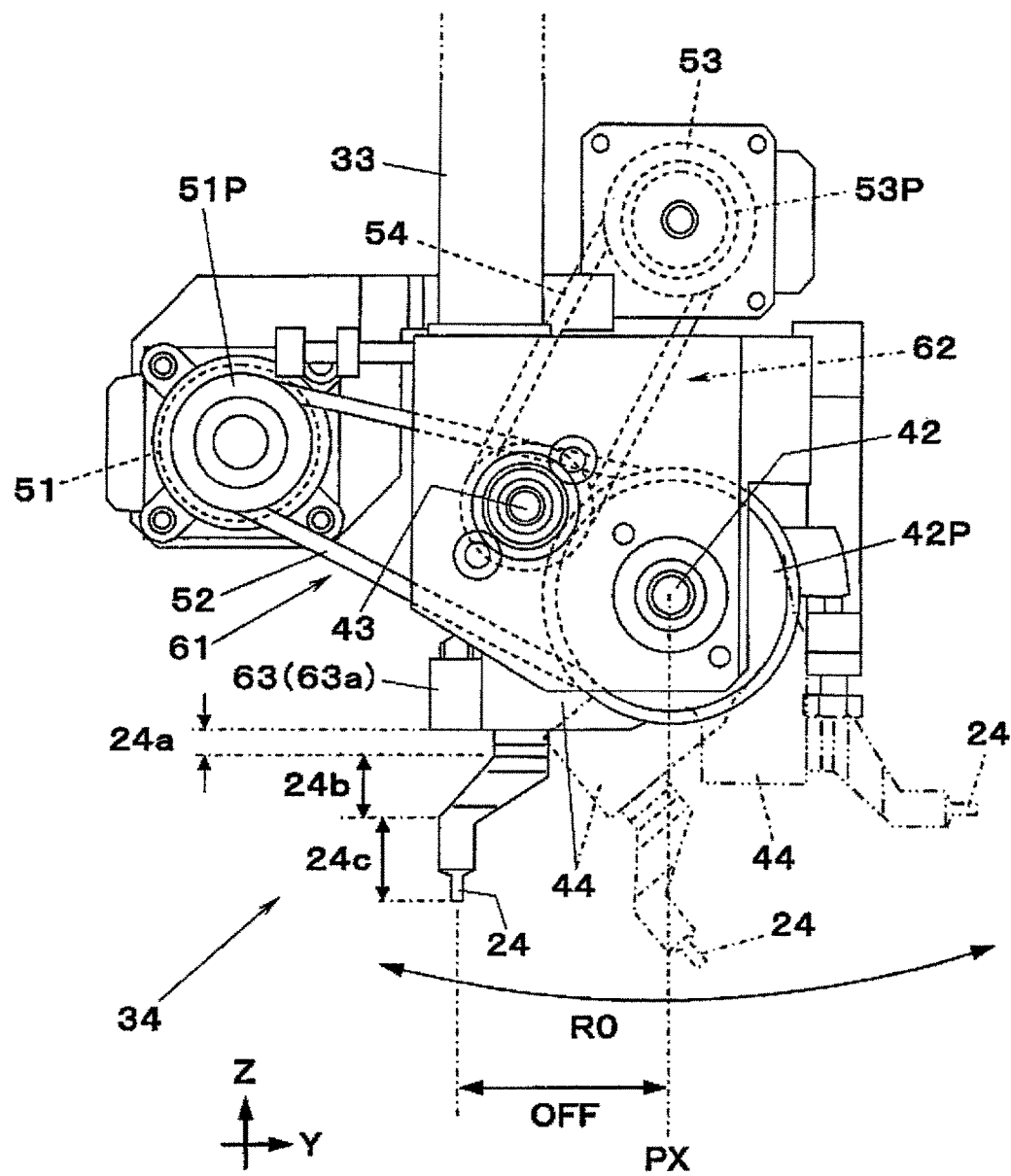
FIG. 9 is a side view of the gripping unit which is provided in the insertion head according to the embodiment of the present invention.

In the embodiment, as illustrated in FIG. 9, each of the gripping claws 24 respectively extends while being bent on the swing surface Fm. Specifically, each of the gripping claws 24 includes a base portion 24*a* which extends in a straight line on the swing surface Fm from the gripping claw holding member 44, an intermediate portion 24*b* which extends in a straight line toward a part which is separated from the swing shaft 42 from the end portion of the base portion 24*a*, and a tip end straight line portion 24*c* (a straight line portion of a tip end) which extends in parallel with respect to the base portion 24*a* from the end portion of the intermediate portion 24*b*. In addition, in a posture of being oriented downward, the tip end straight line portion 24*c* is offset with respect to a perpendicular axis PX that extends on the swing surface Fm through the center axis of the swing shaft 42 (an offset amount is illustrated by a reference numeral OFF in FIG. 9). In the embodiment, the two gripping claws 24 freely swing between a posture in which the tip end straight line portion 24*c* is oriented downward (referred to as a perpendicular posture), and a posture in which the tip end straight line portion 24*c* is oriented in a horizontal direction (FIG. 9).

In FIGS. 7 and 8, there are formed, on the outer circumferential surface of the interval changing shaft 43, one male screw and the other male screw which is a reverse screw to the one male screw bounded on a center portion in an axis direction of the interval changing shaft 43. And a nut 46 which has a female screw that corresponds to the one male screw or the other male screw is screwed in each of one screw forming portion and the other screw forming portion. A flange portion 47 which extends to the swing shaft 42 side is provided in each of the one pair of nuts 46, and the swing shaft 42 passes through each flange portion 47. In addition, each flange portion 47 is bonded to ring-shaped members 48 which are linked to each of the gripping claw holding members 44. For this reason, when the interval changing shaft 43 rotates around the center axis, and the one pair of nuts 46 are separated from or become close to each other, in accordance with this, the two gripping claws 24 are separated from (arrows R1 illustrated in FIG. 10A) or become close to (arrows R2 illustrated in FIG. 10B) each other by the reverse screw.

In FIGS. 6, 7, and 8, a swing motor 51 is provided via a bracket which is not illustrated on a front surface side of the unit base 41. A driving pulley 51P which is attached to the driving shaft which is not illustrated of the swing motor 51 is linked to a driven pulley 42P which is provided in the swing shaft 42 by a power transmission belt 52. For this reason, it is possible to drive the swing shaft 42 by the swing motor 51, and to control the swing posture of the two gripping claws 24 by controlling a rotating direction and a rotating speed of the driving shaft of the swing motor 51.

An interval changing motor 53 is provided via a bracket which is not illustrated in the upper surface portion 41*a* of the unit base 41. A driving pulley 53P which is attached to a driving shaft 53J of the interval changing motor 53 is linked to a driven pulley 43P which is provided in the interval changing shaft 43 by a power transmission belt 54. For this reason, it is possible to drive the interval changing shaft 43 by the interval changing motor 53, and to control the interval between the two gripping claws 24 by controlling a rotating direction and a rotating speed of the driving shaft 53J of the interval changing motor 53.

As described above, in the embodiment, each insertion head 23 includes a swing mechanism 61 which rotates and drives the swing shaft 42 that is a horizontal shaft member, and swings the one pair of gripping claw holding members 44 around the center axis of the swing shaft 42, and an interval changing mechanism 62 which moves the one pair of gripping claw holding members 44 on the swing shaft 42, and changes the interval between the one pair of gripping claws 24. The swing shaft 42 which swings the one pair of the gripping claw holding members 44 (that is, one pair of gripping claws 24) is configured to serve as a moving shaft when changing the interval between the gripping claws 24 (FIGS. 7 and 8). Here, the swing mechanism 61 includes the swing motor 51, the driving pulley 51P, the power transmission belt 52, the driven pulley 42P, and the like. In addition, the interval changing mechanism 62 includes the interval changing motor 53, the driving pulley 53P, the power transmission belt 54, the driven pulley 43P, and the like. In FIGS. 7, 8, and 9, in the upper surface portion 41a of the unit base 41, a pusher 63 which elevates up and down a pressing portion 63a provided at a lower end is provided to extend downward.

Figure 11:
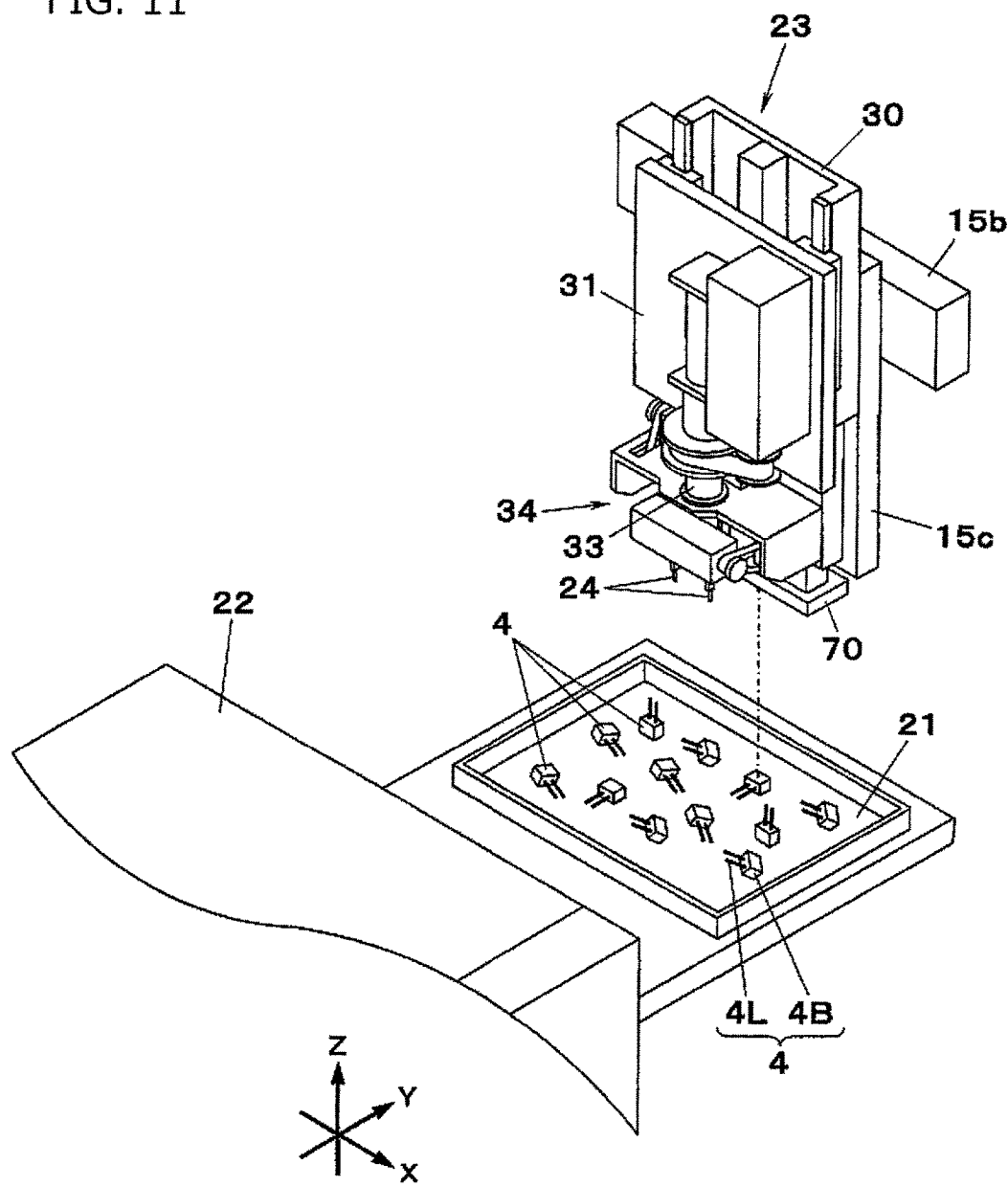
FIG. 11 is a perspective view of the insertion head which is provided in the component insertion device according to the embodiment of the present invention together with the tray feeder.

In FIG. 6, a component recognizing camera 70 in which the imaging visual field is oriented downward is provided at the lower end of the head attaching plate 15c. The component recognizing camera 70 is moved by the head moving mechanism 15 together with the insertion head 23, and the insertion head 23 images the leaded component 4 on the tray 21 which is a target to be gripped by the one pair of gripping claws 24, from above (FIG. 11).

Figure 12:
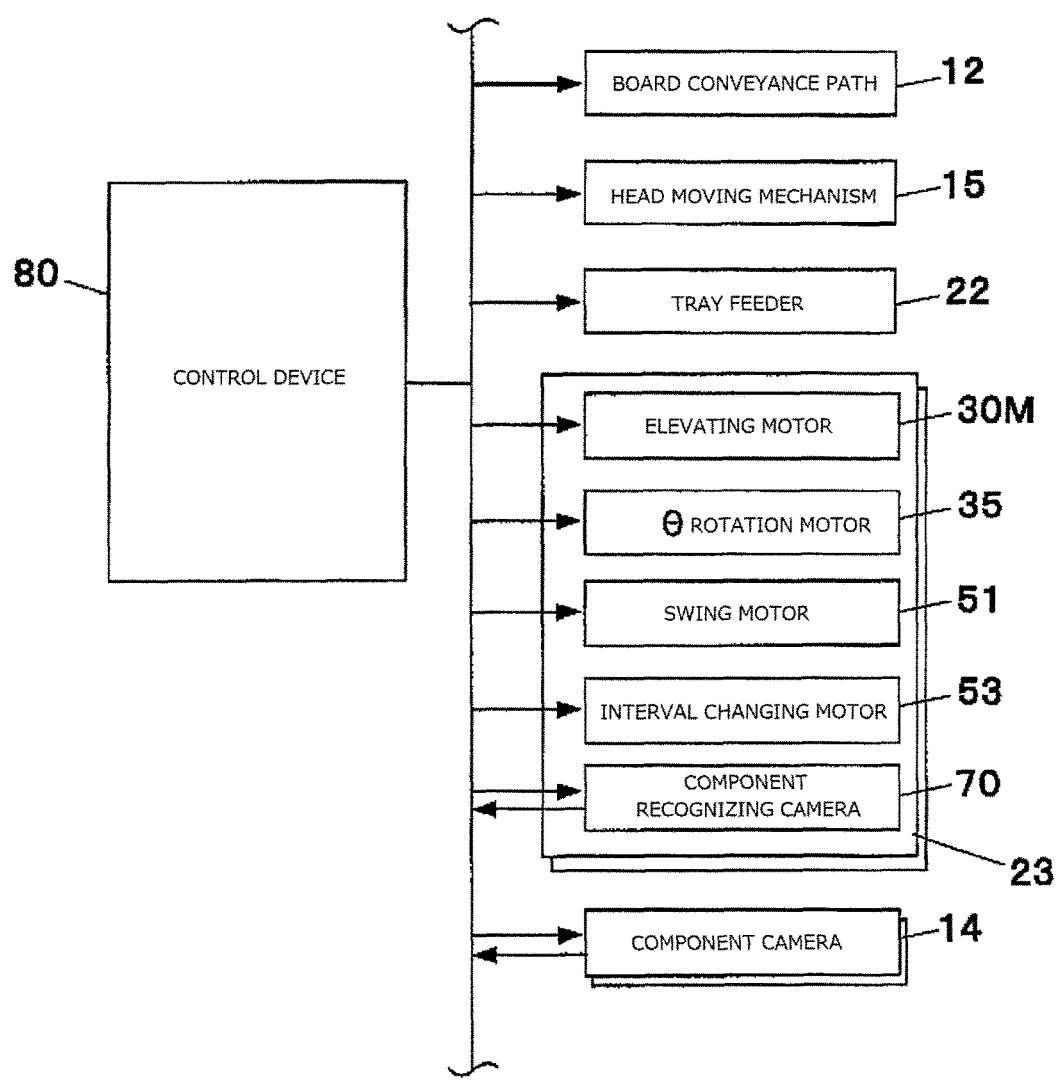
FIG. 12 is a block diagram illustrating a control system of the component insertion device according to the embodiment of the present invention.

As illustrated in FIG. 12, a conveying and positioning operation control of the printed circuit board 2 by the board conveyance path 12, a moving operation control of the insertion head 23 by the head moving mechanism 15, and a supplying operation control of the leaded component 4 by the tray feeder 22, are performed by a control device 80 which is provided in the component insertion device 1B. A elevating operation control of the gripping unit 34 by the elevating motor 30M in each insertion head 23, a rotating operation control around the Z axis of the gripping unit 34 by the θ rotation motor 35, a swing operation control of the gripping claw 24 by the swing motor 51, and an interval changing control of the gripping claw 24 via the interval changing motor 53, are also performed by the control device 80. A recognizing operation control by the component recognizing camera 70 which is provided in each insertion head 23 and a recognizing operation control by each component camera 14 are performed by the control device 80.

Next, procedures of gripping the leaded component 4 and inserting the leaded component 4 into the printed circuit board 2 by the insertion head 23 of the component insertion device 1B configured in this manner will be described. When gripping the leaded component 4 which is supplied in a state of being placed on the tray 21 by the tray feeder 22 by the insertion head 23, the head moving mechanism 15 which is controlled by the control device 80 moves the insertion head 23, and positions the component recognizing camera 70 above the leaded component 4 which is a target to be gripped on the tray 21. In addition, the component recognizing camera 70 images the leaded component 4 (FIG. 11), and the control device 80 grasps a position and a posture of the leaded component 4 based on the obtained image.

Figures 13A, 13B, 13C:
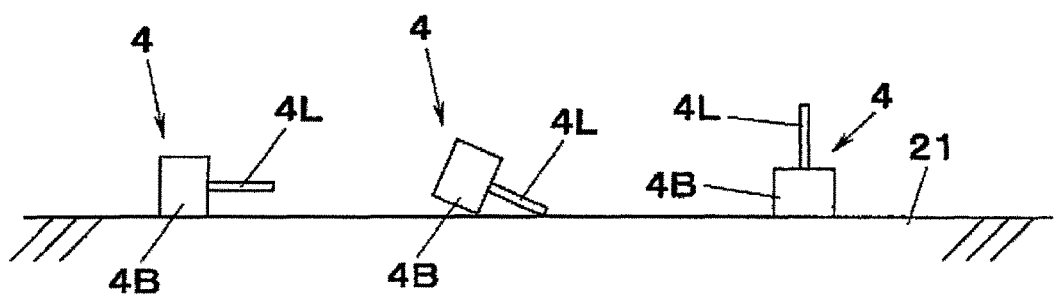
FIGS. 13A, 13B, and 13C are side views of a leaded component which is placed on a tray that is provided in the component insertion device according to the embodiment of the present invention.

The posture of the leaded component 4 is grasped by recognizing a direction in which the lead 4L extends in an image which is obtained by imaging the leaded component 4 from above, a positional relationship between the lead 4L and the main body portion 4B, dimensions and shapes of all of the leaded components 4, and the like. Accordingly, for example, it is possible to grasp various postures of the leaded components 4 as illustrated in FIGS. 13A, 13B, and 13C. The leaded component 4 on a right side illustrated in FIG. 13A is an example in which only a side surface of the main body portion 4B is in contact with the tray 21 and the lead 4L is in a horizontal posture. The leaded component 4 at the center illustrated in FIG. 13B is an example in which the main body portion 4B and the lead 4L are in contact with a bottom surface of the tray 21 together, and the whole leaded component 4 is in a posture of being inclined with respect to the tray 21. The leaded component 4 on a left side illustrated in FIG. 13C is an example in which a ceiling surface of the main body portion 4B is in contact with the tray 21 and the lead 4L in a headstand posture of being oriented upward.

Figure 14:
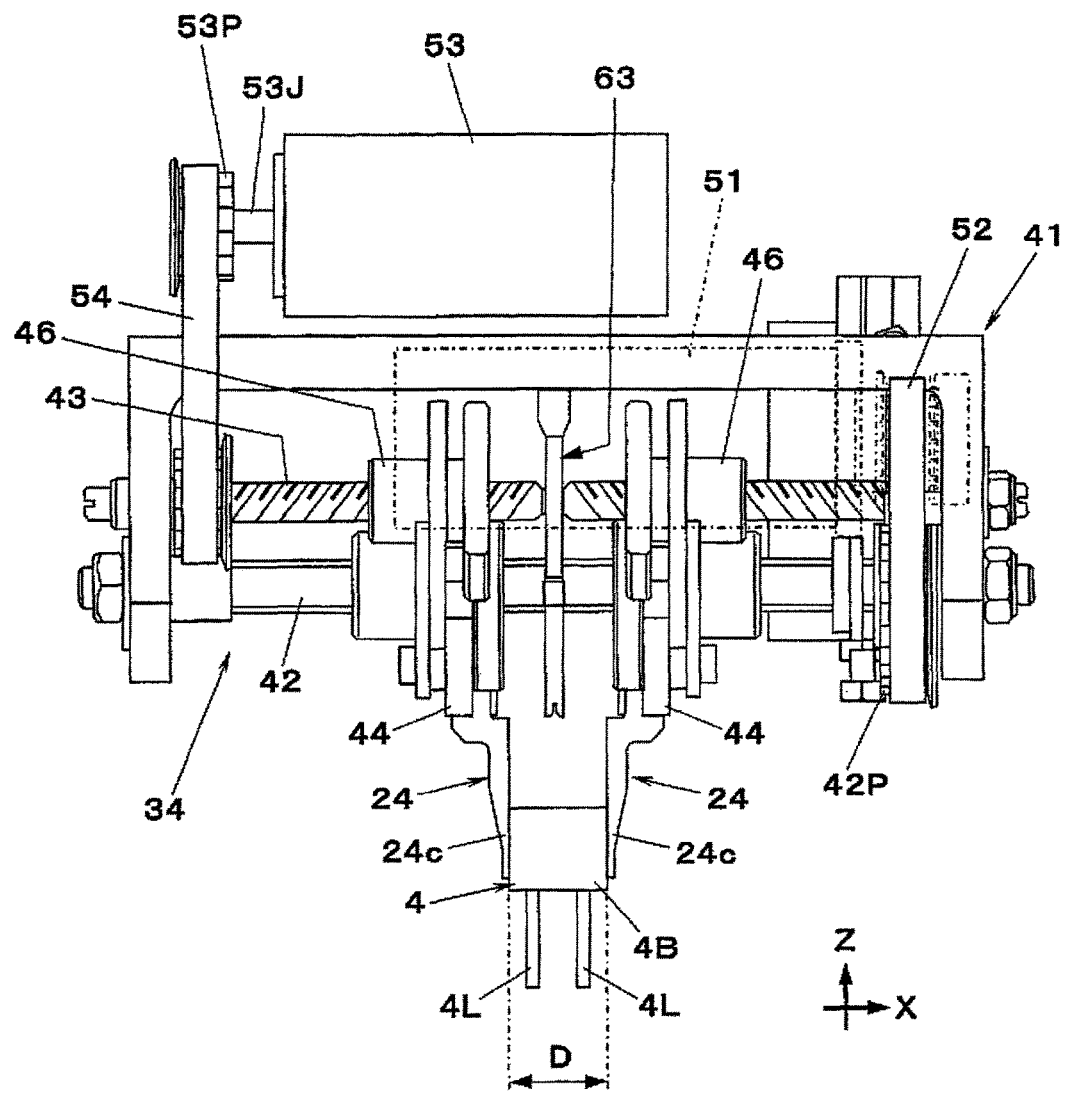
FIG. 14 is a front view of the gripping unit which is provided in the insertion head according to the embodiment of the present invention.
Figure 15A:
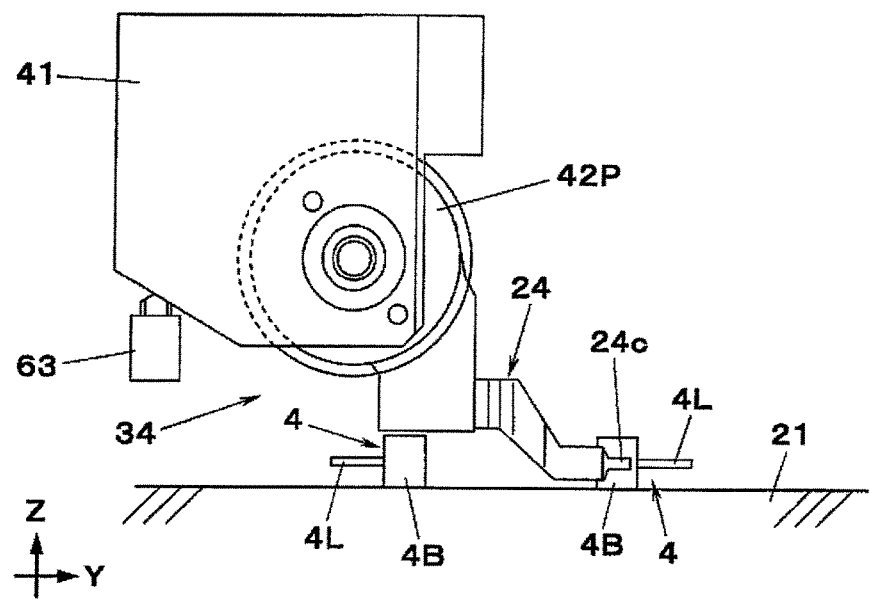
FIGS. 15A and 15B are side views of the gripping unit which is provided in the insertion head according to the embodiment of the present invention.
Figure 15B:
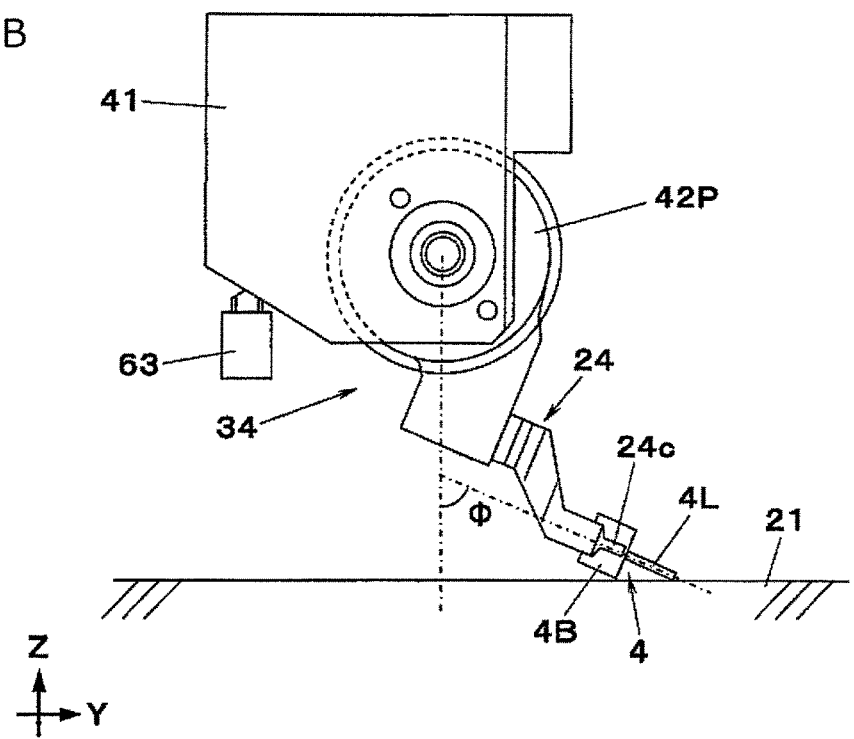

The control device 80 performs the posture control of the gripping unit 34 so that the main body portion 4B of the leaded component 4 can be gripped by the one pair of the gripping claws 24 based on the position and the posture of the gripped leaded component 4 when the position and the posture of the leaded component 4 are gripped. Specifically, the elevating motor 30M is operated in accordance with the height of the tray 21 of the gripping unit 34, and the θ rotation motor 35 is operated in accordance with a rotation angle around the Z axis of the gripping unit 34. In addition, the swing motor 51 is operated so that a direction in which the tip end straight line portion 24c of the gripping claw 24 extends matches a direction in which the lead 4L extends, and the interval changing motor 53 is operated so that the interval between the one pair of the gripping claws 24 becomes a value which is greater than a width-direction dimension D (FIG. 14) of the main body portion 4B of the leaded component 4. In addition, accordingly, when the one pair of gripping claws 24 are in a gripping preparation posture in which the gripping claws 24 are positioned on a side of the main body portion 4B of the leaded component 4, the one pair of gripping claw holding members 44 are moved in a direction of becoming close to each other, and the main body portion 4B of the leaded component 4 is gripped by the one pair of gripping claws 24. FIG. 15A illustrates a state where the leaded component 4 is gripped by setting a swing angle Φ (refer to FIG. 15B) from the perpendicular posture of the one pair of gripping claws 24 to 90 degrees. FIG. 15B illustrates a state where the leaded component 4 is gripped by setting the swing angle Φ from the perpendicular posture of the one pair of gripping claws 24 to be an angle between 0 degrees and 90 degrees.

Here, as described above, each of the gripping claws 24 extend to be bent on the swing surface Fm, and the tip end straight line portion 24c thereof is offset with respect to the perpendicular axis PX that extends on the swing surface Fm through the center axis of the swing shaft 42 in a posture of being oriented downward. Therefore, in the gripping preparation posture, even when the gripping claw 24 has a large swing angle Φ from the perpendicular posture of being oriented downward, the shaft member (that is, the swing shaft 42) for swinging the gripping claw 24 is positioned above the tip end straight line portion 24c. For this reason, regardless of the posture of the leaded component 4 during the supply thereof, a part which is near the swing shaft 42 does not interfere with another leaded component 4 that is adjacent to the leaded component 4 that is a target to be gripped, and it is possible to stably grip the leaded component 4 (FIG. 15A).

When the leaded component 4 is gripped by the one pair of gripping claws 24, the control device 80 performs a control of making the gripping claws 24 become close to each other by considering a target interval d (<D) which is set to be a value that is smaller than the width-direction dimension D of the leaded component 4 as a target value. Accordingly, the leaded component 4 is solidly gripped with a gripping force which is in accordance with a difference (D-d) of the interval between the one pair of gripping claws 24. Here, the target interval d is set variably in accordance with the width-direction dimension D which is calculated by recognizing a type or an image of the leaded component 4. The set target interval d may be determined in advance in accordance with the width-direction dimension D of the leaded component 4, and may be determined by calculating every time that gripping is performed. In this manner, in the insertion head 23 of the component insertion device 1B in the embodiment, by the interval changing control of the one pair of gripping claws 24 via the interval changing mechanism 62, the gripping force of the leaded component 4 changes by the one pair of gripping claws 24.

Figure 16A:
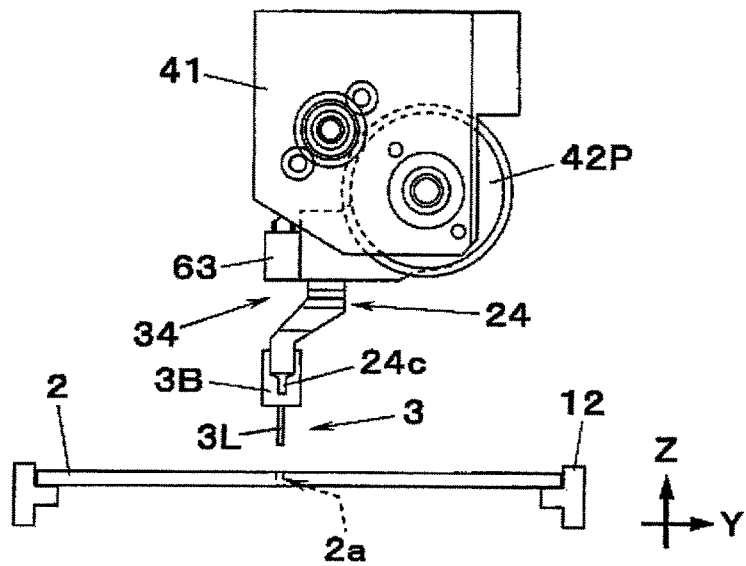
FIGS. 16A, 16B, and 16C are views illustrating an order of inserting the leaded component into a printed circuit board by the insertion head according to the embodiment of the present invention.

When the main body portion 4B of the leaded component 4 is gripped by the one pair of gripping claws 24, the swing motor 51 which is controlled by the control device 80 rotates the swing shaft 42, and makes the one pair of gripping claws 24 be in the perpendicular posture. The one pair of gripping claws 24 can grip the leaded component 4, and are adjusted so that the direction in which the tip end straight line portion 24c extends match the direction in which the lead 4L of the leaded component 4 extends. For this reason, by making the one pair of gripping claws 24 which grip the main body portion 4B of the leaded component 4 be in the perpendicular posture, it is possible to make the leads 4L of the gripped leaded component 4 be oriented downward (FIG. 16A).

Figure 16B:
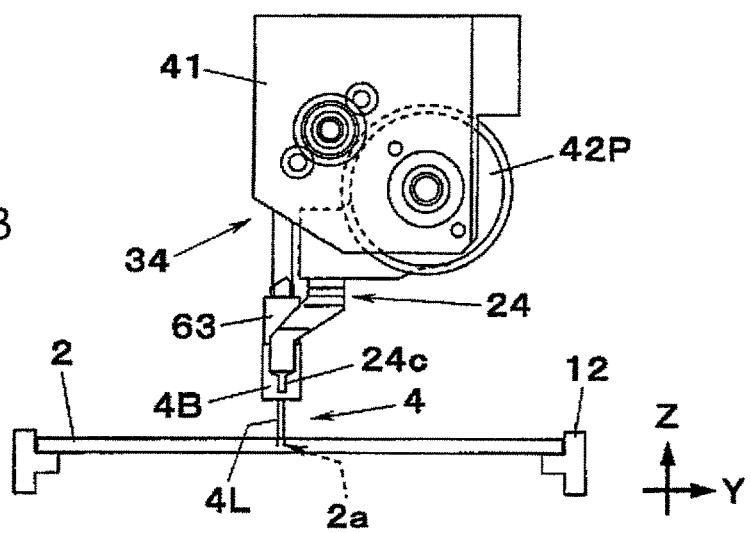
Figure 16C:
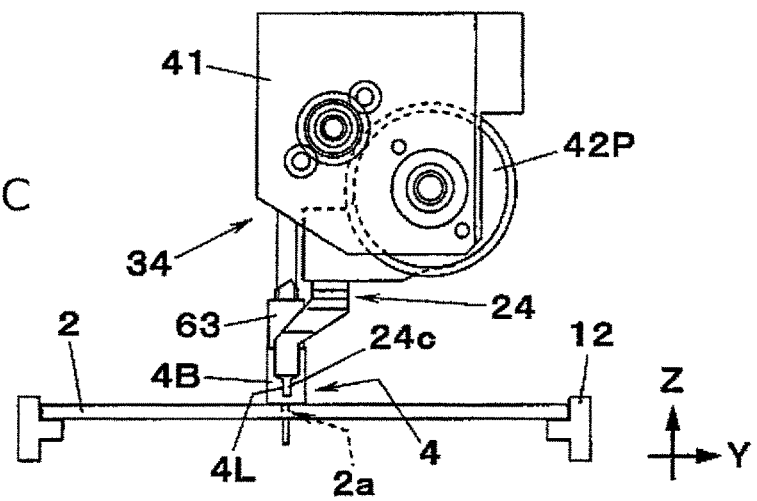

When the leads 4L of the leaded component 4 are oriented downward by making the one pair of gripping claws 24 be in the perpendicular posture, the head moving mechanism 15 moves the insertion head 23 so that the leaded component 4 passes through above the component camera 14, and makes the component camera 14 recognize the leads 4L of the leaded component 4. When the component camera 14 recognizes the leads 4L, based on the recognition result, the head moving mechanism 15 positions the insertion head 23 so that the lower end of the leads 4L of the leaded component 4 are positioned above the insertion holes 2a on the printed circuit board 2 to which the leaded component 4 is mounted (FIG. 16A). In addition, the head moving mechanism 15 lowers the elevating plate 31 with respect to the base portion 30, and presses the leaded component 4 onto the printed circuit board 2 (FIG. 16C) while inserting the lower ends of the leads 4L into the insertion holes 2a (FIG. 16B). At this time, the control device 80 operates the pusher 63, lowers the pressing portion 63a, and supports pressing the leaded component 4 onto the printed circuit board 2 by the insertion head 23. Accordingly, the leaded component 4 is mounted (inserted) onto the printed circuit board 2.

As described above, in the component insertion device 1B in the embodiment, while the one pair of gripping claws 24 which are provided in the insertion head 23 are provided to be movable on the horizontal swing shaft 42, and swingable around the center axis of the swing shaft 42 as the swing shaft 42 is rotated and driven, the gripping claws 24 move on the swing shaft 42 and the interval therebetween configured to be changed. In other words, the swing shaft 42 which swings the one pair of gripping claws 24 is configured to serve as the moving shaft when changing the interval between the gripping claws 24. For this reason, it is possible to reduce the number of components, and to make the size of the insertion head compact.

In addition, in the embodiment, by the interval changing control between the one pair of gripping claws 24 via the interval changing mechanism 62, it is possible to change the gripping force of the leaded component 4 by the one pair of gripping claws 24, and by setting the gripping force of the leaded component 4 in accordance with the size, weight or surface roughness of the leaded component 4, it is possible to grip the leaded component 4 with an appropriate amount of force. For this reason, there is no concern that the leaded component 4 which is once gripped is dropped, or the leaded component 4 is gripped with an excessively large amount of force.

Furthermore, in the embodiment, each gripping claw 24 extends to be bent on the surface (swing surface Fm) which is orthogonal to each of the swing shafts 42, and the straight line portion (tip end straight line portion 24c) of the tip end is offset with respect to the perpendicular axis PX that extends on the swing surface Fm through the center axis of the swing shaft 42 in a posture of being oriented downward. Therefore, even when the swing angle Φ from the perpendicular posture of the gripping claw 24 is large, the position of the swing shaft 42 which swings the gripping claw 24 is positioned above the tip end straight line portion 24c of the swung gripping claw 24, not on the side of the tip end straight line portion 24c. For this reason, regardless of the posture of the leaded component 4 during the supply thereof, there is little concern that the part which is near the swing shaft 42 interferes with another leaded component 4 that is adjacent to the leaded component 4 that is the target to be gripped, and it is possible to stably grip the leaded component 4 which is the target to be gripped.

In addition, in the component insertion device 1B in the embodiment, since the component recognizing camera 70 is provided as component recognizing means for recognizing the leaded component 4, before gripping the leaded component 4 with the gripping claw 24, it is possible to grasp the posture of the leaded component 4 in advance, and the control device 80 which serves as control means can make the one pair of gripping claws 24 grip the leaded component 4 which is supplied by the tray feeder 22 by controlling the swing mechanism 61 and the interval changing mechanism 62 of the insertion head 23 based on the recognition result of the leaded component 4 by the component recognizing camera 70. For this reason, the tray feeder 22 which serves as a component supply portion supplies the plurality of leaded components 4 in a state of being loaded on the tray 21, and even when the plurality of leaded components 4 are respectively oriented in various directions on the tray 21, it is possible to reliably grip the leaded component 4 by the insertion head 23 and insert the leaded component 4 into the printed circuit board 2.

Figure 17:
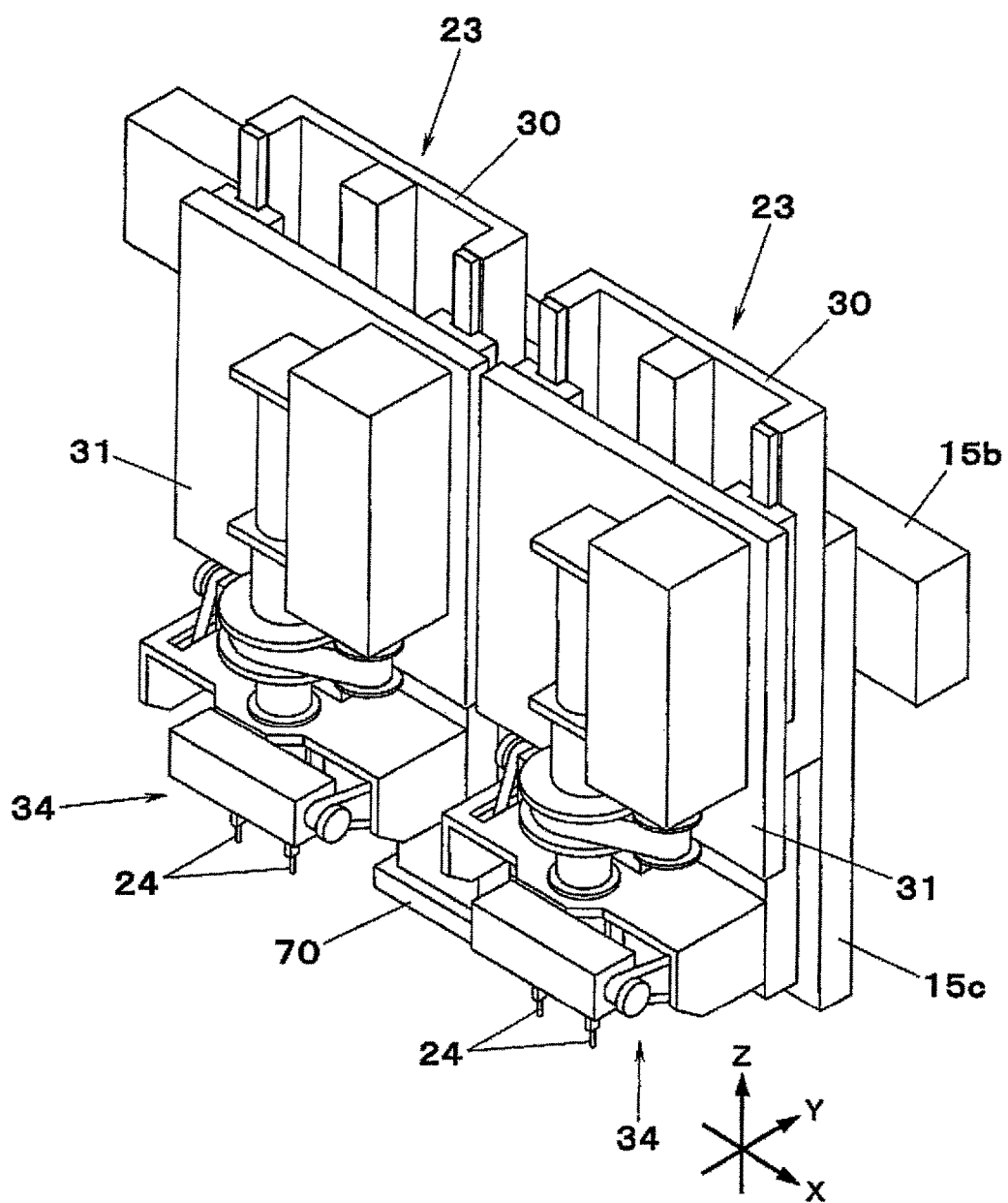
FIG. 17 is a perspective view of the insertion head which is provided in the component insertion device according to the embodiment of the present invention.

In the component insertion device 1B illustrated in the above-described embodiment, it is configured that the insertion heads 23 are attached to each of the head attaching plates 15c one by one, but as illustrated in FIG. 17, a work efficiency may be improved by attaching the plurality of insertion heads 23 that operate independently from each other to each of the head attaching plates 15c. In addition, even in a configuration in which the plurality of insertion heads 23 are attached to one head attaching plate 15c, it is sufficient to provide only one component recognizing camera 70 to the head attaching plate 15c (FIG. 17).

Figure 18:
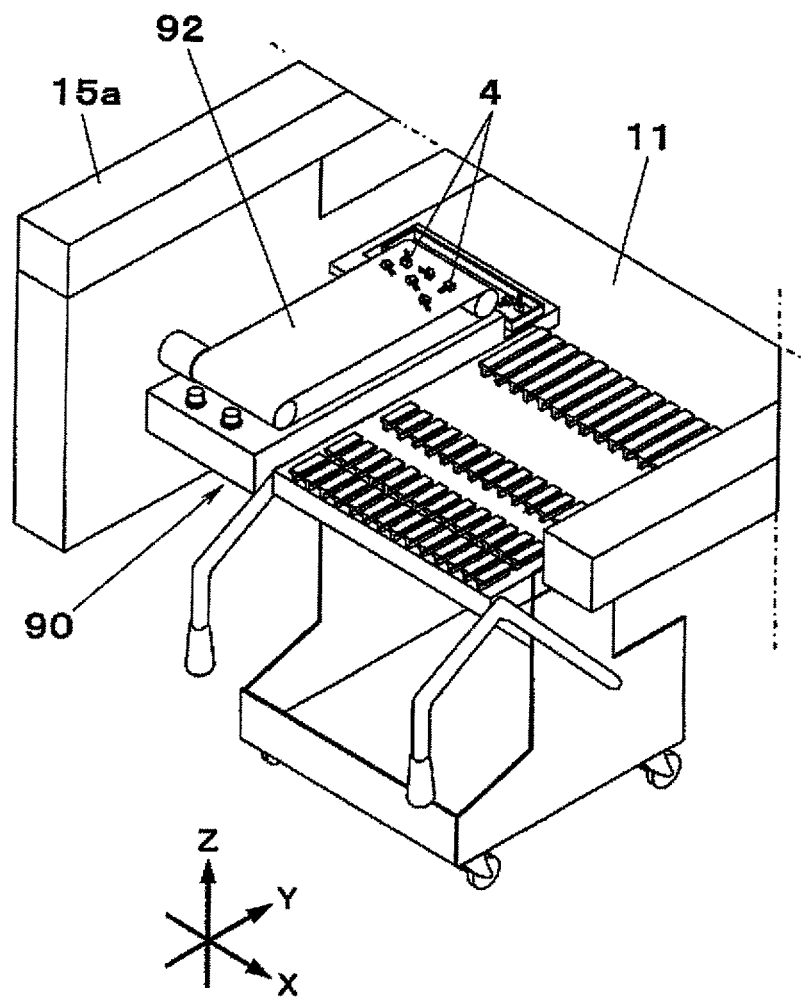
FIG. 18 is a view illustrating a state where a conveyor type feeder is attached to the component insertion device according to the embodiment of the present invention.
Figure 19:
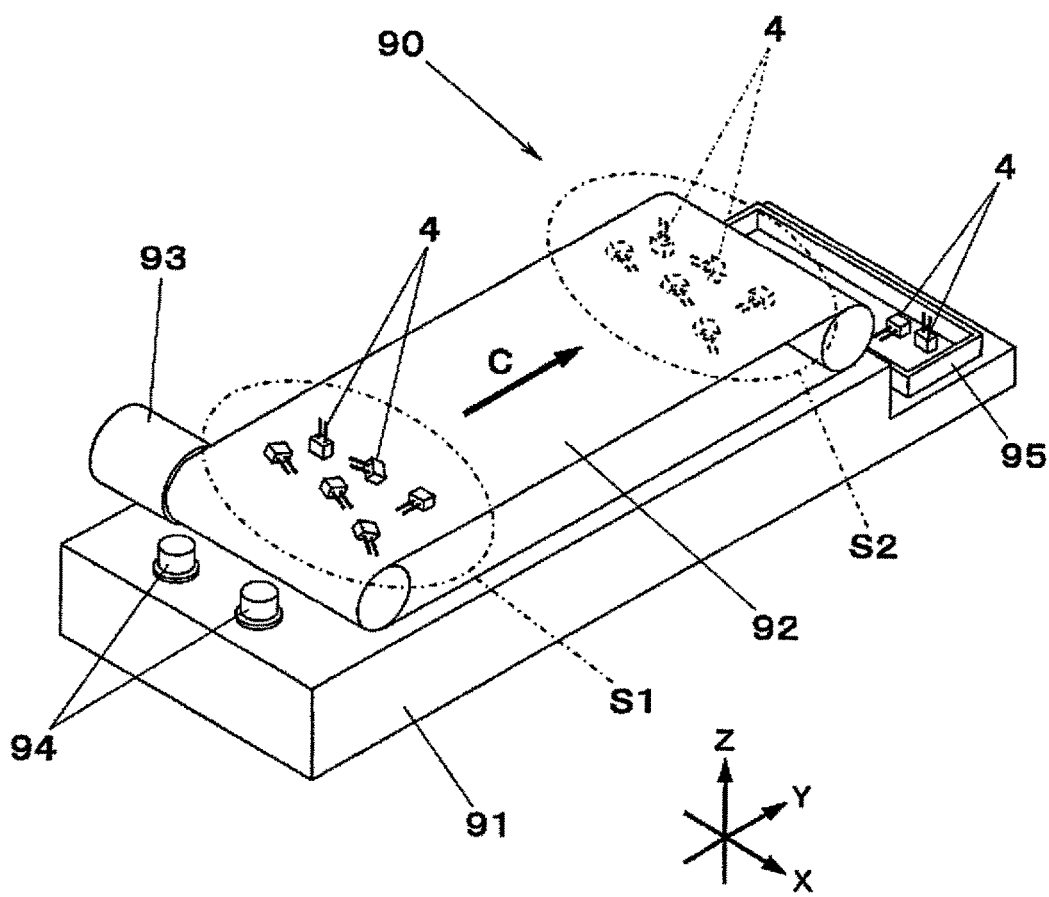
FIG. 19 is a perspective view of the conveyor type feeder to the component insertion device according to the embodiment of the present invention.

In addition, in the above-described embodiment, although the tray feeder 22 is illustrated as means for supplying the plurality of leaded components 4 which are oriented in various directions into the movable region of the insertion head 23, it is possible to supply the leaded component 4 by using a conveyor type feeder 90 as illustrated in FIG. 18. As illustrated in FIG. 19, the conveyor type feeder 90 is provided with a conveyor 92 in which a conveying direction on a base 91 which is linked to the base 11 is the Y-axis direction, and a motor 93 which drives the conveyor 92 operates in accordance with an operation of an operation button 94 provided on the base 91. After the operator OP places the leaded components 4 without particularly lining up the leaded components 4 to a component placing region Si on a near side of the conveyor 92, by operating the conveyor 92 by pressing the operation button 94, and moving the leaded component 4 to a supply region S2 in the movable region of the insertion head 23 (arrow C illustrated in FIG. 19), it is possible to perform component supplying which is similar to that of the above-described tray feeder 22. In addition, in a box member 95 illustrated in FIG. 19, the leaded component 4 which is moved to the supply region S2 cannot be recognized by the component recognizing camera 70, or cannot be gripped by the insertion head 23, and is dropped by the operation of the conveyor 92. After the leaded component 4 which is dropped to the box member 95 is collected by the operator OP, the leaded component 4 is placed in the component placing region S1 again.

In addition, when the component mounting line 1 is made as the component insertion device 1B and the component mounting device 1A in which the surface mounting component 3 is mounted on the printed circuit board 2 are linked to each other, as in the embodiment, it is preferable that the component insertion device 1B is disposed to be closer to the downstream side of the flow of the printed circuit board 2 than all of the component mounting devices 1A which are included in the component mounting line 1. In such a configuration, since the leaded component 4 of which the size is generally greater than that of the surface mounting component 3 is attached to the printed circuit board 2 at a following step after attaching the surface mounting component 3, it is possible to make the flow of manufacturing the printed circuit board smooth.

In addition, in the component mounting device 1A and the component insertion device 1B illustrated in the above-described embodiment, when the mounting head 16 and the insertion head 23 are configured to be attached to the head attaching plate 15c compatible with each other, it is possible to make a main body configuration of the component mounting device 1A and the component insertion device 1B a common configuration. Furthermore, by making it possible to attach a coating head which coats a paste or an inspection head which is provided with a camera for inspection to the head attaching plate 15c, it is possible to make the main configuration not only the component mounting device 1A and the component insertion device 1B, but also a paste coating device or an inspection device the common configuration, and to configure a component mounting line of various variations in accordance with a type of the printed circuit board 2 to be produced at an extremely low coast.

There are provided an insertion head, a component insertion device, and a component mounting line which can stably grip a leaded component regardless of a posture of the leaded component during the supply thereof.

What is claimed is:

1. An insertion head comprising:
    a horizontal shaft member;
    one pair of gripping claws, each gripping claw including a tip end straight line portion and extending on a corresponding surface which is orthogonal to the horizontal shaft member;
    one pair of gripping claw holding members which are provided to be movable on the horizontal shaft member, and hold the one pair of gripping claws;
    a swing mechanism which rotates and drives the horizontal shaft member, and swings the one pair of gripping claw holding members around a center axis of the horizontal shaft member; and
    an interval changing mechanism which moves the one pair of gripping claw holding members on the horizontal shaft member and changes an interval between the one pair of gripping claws, wherein
    the one pair of gripping claws is configured to grip a leaded component, and to insert a lead of the leaded component into an insertion hole on a printed circuit board, and
    each of the gripping claws respectively is bent and extends on the surface, and each tip end straight line portion has a longitudinal axis contained within a plane parallel to and spaced from a plane containing the center axis of the horizontal shaft member.

2. The insertion head according to claim 1, further comprising:
    a component recognizing portion configured to recognize the leaded component.

3. A component insertion device comprising:
    the insertion head according to claim 2;
    a component supply portion which supplies the leaded component;
    and
    a control portion which controls the swing mechanism and the interval changing mechanism of the insertion head based on a recognition result of the leaded component by the component recognizing portion to grip the leaded component supplied by the component supply portion with the one pair of gripping claws.

4. The component insertion device according to claim 3, wherein the component supply portion is configured to supply a plurality of leaded components in a state of being loaded on a tray or a conveyor, and to respectively orient the plurality of leaded components in various directions on the tray or the conveyor.

5. A component mounting line comprising:
    the component insertion device according to claim 3; and
    at least one component mounting device configured to mount a surface mounting component to the printed circuit board, wherein
    the component insertion device and the at least one component mounting device are linked.

6. The component mounting line according to claim 5, wherein the component insertion device is disposed to be closer to a downstream side of a flow of the printed circuit board than all of the at least one component mounting device included in the component mounting line.

* * * * *